(12) United States Patent
Cai et al.

(10) Patent No.: US 9,058,902 B2
(45) Date of Patent: Jun. 16, 2015

(54) METHOD OF DETECTING TRANSISTORS MISMATCH IN A SRAM CELL

(71) Applicant: Shanghai Huali Microelectronics Corporation, Shanghai (CN)

(72) Inventors: Enjing Cai, Shanghai (CN); Qiang Li, Shanghai (CN); Wen Wei, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/040,733

(22) Filed: Sep. 30, 2013

(65) Prior Publication Data

US 2015/0029783 A1    Jan. 29, 2015

(30) Foreign Application Priority Data

Jul. 25, 2013    (CN) .......................... 2013 1 0317737

(51) Int. Cl.
| | | |
|---|---|---|
| *G11C 29/50* | (2006.01) | |
| *G11C 11/417* | (2006.01) | |
| *G11C 11/41* | (2006.01) | |

(52) U.S. Cl.
CPC ........ *G11C 29/50008* (2013.01); *G11C 11/417* (2013.01); *G11C 2029/5004* (2013.01); *G11C 2029/5006* (2013.01); *G11C 11/41* (2013.01); *G11C 2029/5002* (2013.01)

(58) Field of Classification Search
CPC .... G11C 11/41; G11C 11/412; G11C 11/413; G11C 11/417; G11C 29/50; G11C 29/50004; G11C 29/50008; G11C 29/50012; G11C 29/50016; G11C 2029/5002; G11C 2029/5004; G11C 2029/5006
USPC .................. 365/200, 201, 154, 156; 714/735
See application file for complete search history.

(56) References Cited

U.S. PATENT DOCUMENTS

| | | | | |
|---|---|---|---|---|
| 6,212,115 | B1 * | 4/2001 | Jordan ........................... | 365/201 |
| 7,924,640 | B2 * | 4/2011 | Deng et al. ..................... | 365/201 |
| 8,437,213 | B2 * | 5/2013 | Deng et al. ..................... | 365/226 |
| 8,447,547 | B2 * | 5/2013 | Jung et al. ....................... | 702/69 |
| 8,705,300 | B1 * | 4/2014 | Xu et al. ......................... | 365/201 |
| 2008/0062746 | A1 * | 3/2008 | Loh et al. ....................... | 365/154 |

* cited by examiner

*Primary Examiner* — Harry W Byrne
*Assistant Examiner* — Lance Reidlinger
(74) *Attorney, Agent, or Firm* — Anova Law Group, PLLC

(57) ABSTRACT

The present invention provides a method of detecting the transistor mismatch in a SRAM cell. The SRAM cell comprises two pass-gate transistors and a bi-stable circuit including two pull up transistors and two pull down transistors. The method comprises: providing two measuring transistors, whose gates are connected to a second word line, sources are connected to the outputs of the bi-stable circuit respectively and drains are connected to two measuring terminals respectively; turning on the measuring transistors and turning off the pass-gate transistors; detecting the voltage-current curve of the two pull down transistors and the two pull up transistors through the measuring transistors at the measuring terminals so as to detect the transistor mismatch in the SRAM cell.

6 Claims, 2 Drawing Sheets

METHOD OF DETECTING TRANSISTORS MISMATCH IN A SRAM CELL

CROSS-REFERENCE TO RELATED APPLICATION

This application claims the priority benefit of China application serial no. 201310317737.1, filed Jul. 25, 2013. All disclosure of the China application is incorporated herein by reference.

FIELD OF THE INVENTION

The present invention relates to the field of semiconductor fabrication technology and particularly to a method of detecting the transistors mismatch in a SRAM cell.

BACKGROUND OF THE INVENTION

The SRAM (static random access memory), which is a memory cell, is widely applied in the personal communications or consumer electronics with its characteristic of high speed and low power consumption.

As shown in FIG. 1, a conventional 6T SRAM cell is structurally symmetrical, which is consist of six transistors M1, M2, M3, M4, M5 and M6. Wherein, the transistors M1, M2 M3 and M4 form a bi-stable circuit to latch a digital signal. The transistors M5 and M6 are Pass-Gate transistors to connect or disconnect the SRAM cell with the peripheral circuit in the read/write or store operation of the SRAM cell.

During the read operation, the word line WL is enabled to a high potential, and the Pass-Gate transistors are turned on to transfer the digital signal (0 or 1) to the bit line BL and the complementary digital signal (1 or 0) to the bit line $\overline{BL}$, then the peripheral circuit will read the data from the bit line BL, $\overline{BL}$. During the write operation, the word line WL is enabled to a high potential and the Pass-Gate transistors are turned on, the peripheral circuit transfers the voltage digital signal to the bit line BL, $\overline{BL}$, so as to write the digital signal (digital data) in the SRAM cell.

According to the SRAM cell manufacturing process currently, with the decrease of the minimum supply voltage (Vmin), the mismatch between the transistors in the SRAM cell occurs more frequently, and thus decrease the product yield. Therefore, fast and reliable detection of the mismatched (or failed) transistors in the SRAM cell makes the key point for the process development. The detection method today mainly utilizes accurate positioning means and measuring devices such as Nano-prober/AFP to detect and find the mismatched transistors. However, such method is time-consuming, costly, and inconvenient for mass data collection.

Therefore, it is necessary to provide a new mismatch detecting method for the transistors in a SRAM cell.

SUMMARY OF THE INVENTION

Accordingly, at least one object of the present invention is to provide a method for detecting the mismatched transistors of the SRAM cell.

To achieve these and other advantages and in accordance with the objective of the invention, as embodied and broadly described herein, the invention provides a method of detecting the transistor mismatch in a SRAM cell, wherein the SRAM cell comprises a first and a second pass gate transistors (PG1, PG2), and a bi-stable circuit which includes a first and a second pull up transistors (PU1, PU2) and a first and a second pull down transistors (PD1, PD2); wherein, the gate electrodes of the first and the second pass-gate transistors are connected to a first word line (WLA), the source electrodes thereof are connected to the outputs of the bi-stable circuit respectively, and the drain electrodes thereof are connected to a first and a second bit line (BL, $\overline{BL}$) respectively; and the method comprises: step a, providing a first and a second measuring transistors (PM1, PM2), the gate electrodes of the first and second measuring transistors (PM1, PM2) are connected to a second word line (WLB), the source electrodes thereof are connected to the outputs of the bi-stable circuit respectively, and the drain electrodes thereof are connected to a first and second measuring terminals ($\overline{BLM}$, BLM) respectively; step b, enabling the second word line (WLB) and disabling the first word line (WLA); step c, determining the value of the data stored in the SRAM cell, if the data is "0", turning to step d1; and if the data is 1, turning to step d2; step d1, detecting the voltage-current curves of the first pull down transistor (PD1) and the second pull up transistor (PU2) at the first and second measuring terminals ($\overline{BLM}$, BLM) respectively, turning to step e; step d2, detecting the voltage-current curves of the first pull up transistor (PU1) and the second pull down transistor (PD2) at the first and second measuring terminal ($\overline{BLM}$, BLM) respectively turning to step e; step e, determining whether the voltage-current curves of the first and second pull down transistors (PD1, PD2) and the first and second pull up transistors (PU1, PU2) are all detected, if no, turning to step f; if yes, turning to step g; step f, enabling the first word line (WLA) and disabling the second word line (WLB), and writing a complementary data into the SRAM cell and turning to step a; step g, determining the transistor mismatch according to the voltage-current curves of the first and second pull down transistors (PD1, PD2) and the first and second pull up transistors (PU1, PU2).

Preferably, the channel length of the first and second measuring transistors (PM1, PM2) is 28 nm or 40 nm or 55 nm.

Preferably, the channel width of the first and second measuring transistors (PM1, PM2) is equal to that of the first and second pass-gate transistors.

Preferably, the first and second measuring transistors are NMOS transistors having the same specifications with the first and second pass-gate transistors.

Preferably, the step S04 further comprises applying a voltage from 0 to VDD to the first measuring terminal (BLM) and detecting the current thereof correspondingly to form the voltage-current curve of the first pull down transistor (PD1); and applying a voltage from VDD to 0 to the second measuring terminal (BLM) and detecting the current thereof correspondingly to form the voltage-current curve of the second pull up transistor (PU2).

Preferably, the step S05 further comprises applying a voltage from VDD to 0 to the first measuring terminal ($\overline{BLM}$) and detecting the current thereof correspondingly to form the voltage-current curve of the first pull up transistor (PU1); and applying a voltage from 0 to VDD to the second measuring terminal (BLM) and detecting the current thereof correspondingly to form the voltage-current curve of the second pull down transistor (PD2).

In the present invention, the mismatched transistors in the SRAM cell can be determined quickly and conveniently, the cost of the mass statistical analysis by the conventional positioning and measuring devices can also be reduced.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Figure 1:
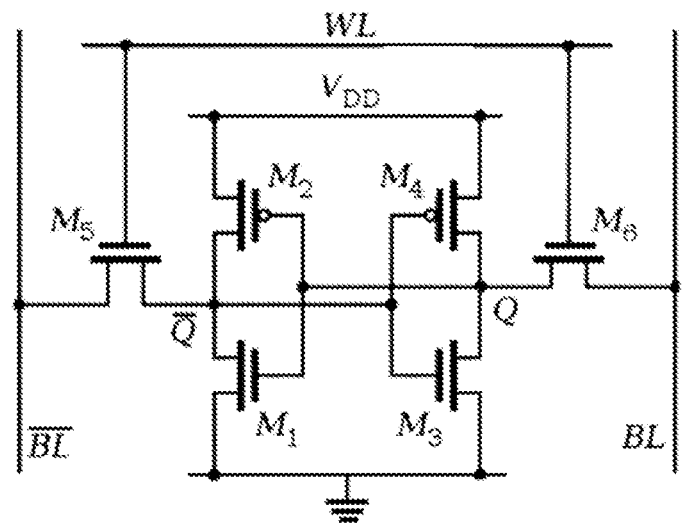
FIG. 1 is a schematic diagram of a conventional SRAM cell.

Reference will now be made in detail to the present preferred embodiments and the accompanying figures of the invention in order to provide a further understanding of the invention. The figures are not drawn to scale and they are provided merely to illustrate the invention instead of limiting the scope of the present invention, like reference numerals are used throughout the figures to designate similar or equivalent element.

Figure 2:
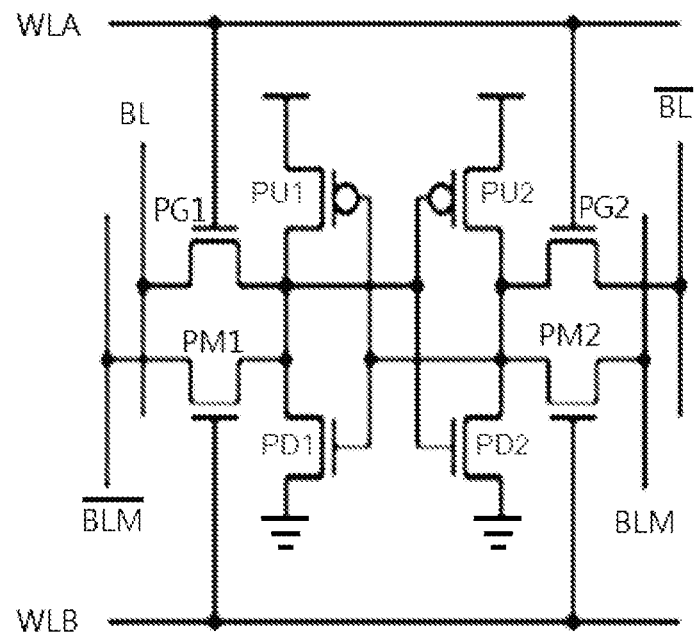
FIG. 2 is a schematic diagram of the SRAM cell in an embodiment of the present invention.

FIG. 2 is a schematic diagram of a SRAM cell to be detected in an embodiment of the present invention.

The SRAM cell comprises a first and a second pull up transistors (PU1, PU2), a first and a second pull down transistors (PD1, PD2), a first and a second pass-gate transistors (PG1, PG2). The first and second pull up transistors (PU1, PU2), the first and the second pull down transistors (PD1, PD2) form a bi-stable circuit for data ("0" or "1") latching. The gate electrodes of the first and second pass-gate transistors (PG1, PG2) are connected to a first word line (WLA), the source electrodes thereof are connected to the two outputs of the bi-stable circuit respectively, and the drain electrodes thereof are connected to a first and second bit lines (BL, $\overline{BL}$) respectively. When the first word line (WLA) is enabled, the SRAM cell can perform the read/write operation; when the first word line (WLA) is disabled, the SRAM cell performs a latch function for storing data.

The SRAM cell is also provided a first and a second measuring transistors (PM1, PM2), wherein the gate electrodes of the measuring transistors are connected to a second word line (WLB), the source electrodes are connected to the two outputs of the bi-stable circuit respectively, and the drain electrodes are connected to a first and second measuring terminals ($\overline{BLM}$, BLM) respectively. The open and close of the measuring transistors (PM1, PM2) are controlled by the second word line (WLB), if the measuring transistors (PM1, PM2) are turned on, the electrical performance such as the current flow of the transistors connected to the measuring transistors can be detected at the measuring terminals ($\overline{BLM}$, BLM). When the measuring transistors PM1, PM2) are turned on, the transistor mismatch can be detected through the measuring terminals ($\overline{BLM}$, BLM). In the embodiment, the channel width of the first and second measuring transistors (PM1, PM2) is equal to that of the first and second pass-gate transistors; the first and second measuring transistors are NMOS transistors having the same specifications with the first and second pass-gate transistors. The channel length of the first and second measuring transistors (PM1, PM2) can be 28 nm or 40 nm or 55 nm.

Figure 3:
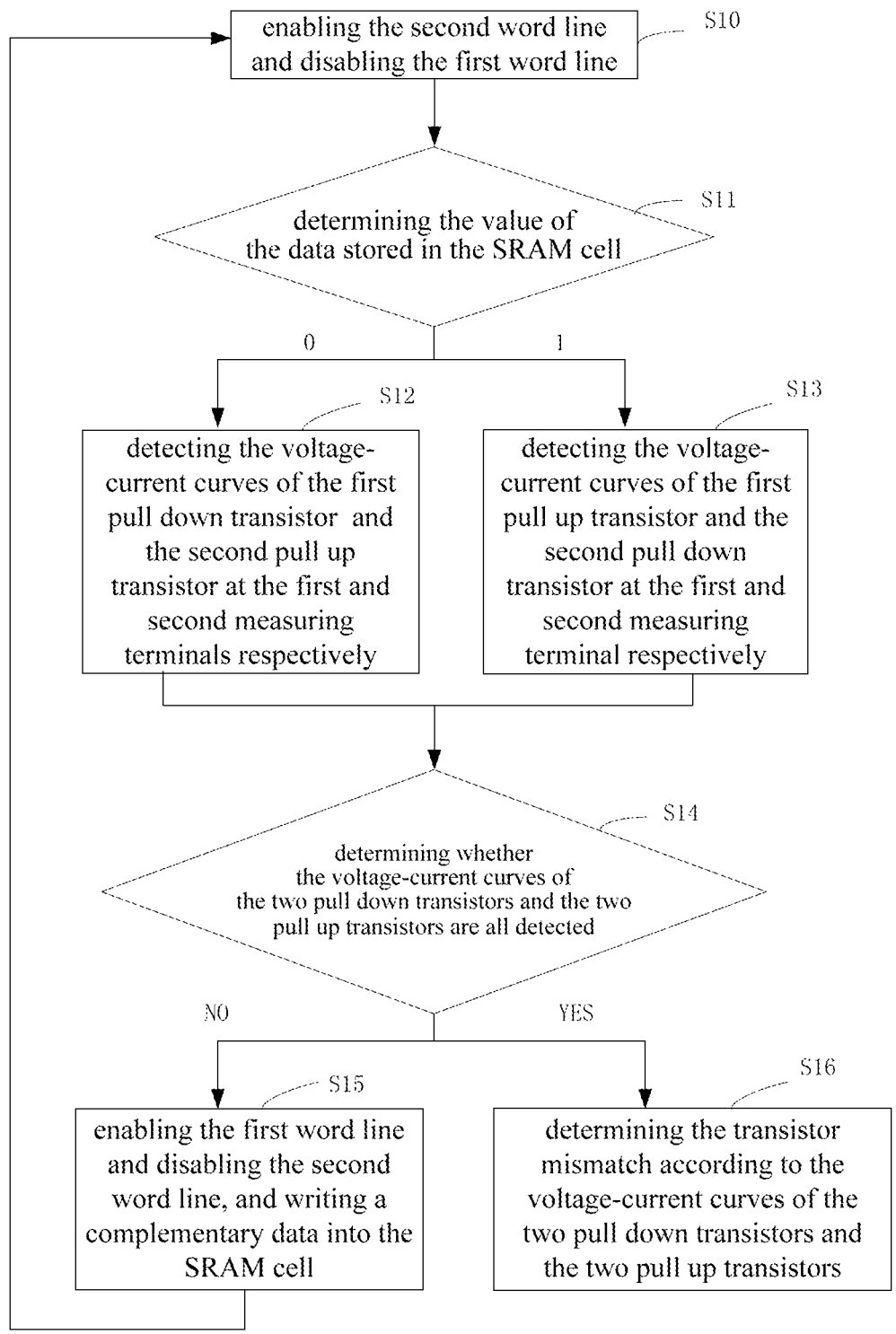
FIG. 3 is a flow chart of the method of detecting the transistor mismatch in the SRAM cell in an embodiment of the present invention.

Referring to FIG. 3, the method of detecting the transistor mismatch in the SRAM cell mentioned above comprises the following steps:

Step S10, enabling the second word line (WLB) and disabling the first word line (WLA). When the second word line (WLB) is enabled and the first word line (WLA) is disabled, the first and second measuring transistors (PM1, PM2) will be turned on and the first and second pass-gate transistors (PG1, PG2) will be turned off. The SRAM cell cannot perform the read/write operation.

Step S11, determining the value of the data stored in the SRAM cell, if the data is "0", turning to Step S12; and if the data is 1, turning to Step S13. That is to say, the step S12 or the step S13 is performed alternatively according to the value of the data stored in the bi-stable circuit of the SRAM cell.

Step S12, detecting the voltage-current curve of the first pull down transistor (PD1) at the first measuring terminal ($\overline{BLM}$) and detecting the voltage-current curve of the second pull up transistor (PU2) at the second measuring terminal (BLM), and turning to Step 14. Since the stored data is "0" and the second word line (WLB) is turned on, the transistors PD1, PU2, as well as the measuring transistors are turned on, thus the electrical performance of the transistors PD1, PU2 can be detected at the measuring terminals ($\overline{BLM}$, BLM) respectively. Specifically, a voltage from 0 to VDD is applied to the first measuring terminal ($\overline{BLM}$) and the current thereof is detected correspondingly, so as to form the voltage-current curve of the first pull down transistor (PD1); a voltage from VDD to 0 is applied to the second measuring terminal (BLM) and the current thereof is detected correspondingly to form the voltage-current curve of the second pull up transistor (PU2).

Step S13 detecting the voltage-current curve of the first pull up transistor (PU1) at the first measuring terminal ($\overline{BLM}$) and detecting the voltage-current curve of the second pull down transistor (PD2) at the second measuring terminal (BLM), and turning to Step 14. Since the stored data is "1" and the second word line (WLB) is turned on, the transistors PU1, PD2, as well as the measuring transistors are turned on, thus the electrical performance of the transistors PU1, PD2 can be detected at the measuring terminals ($\overline{BLM}$, BLM) respectively. Specifically, a voltage from VDD is applied to 0 to the first measuring terminal ($\overline{BLM}$) and the current thereof is detected correspondingly to form the voltage-current curve of the first pull up transistor (PU1); a voltage from 0 to VDD is applied to the second measuring terminal (BLM) and the current thereof is detected correspondingly to form the voltage-current curve of the second pull down transistor (PD2).

In the embodiment, the stored data is assumed to be "0", then the voltage-current curves of the first pull down transistor (PD1) and the second pull up transistor (PU2) will be obtained.

Step S14, determining whether the voltage-current curves of the first and second pull down transistors (PD1,PD2) and the first and second pull up transistors (PU1, PU2) are all detected, if no, turning to Step S15; if yes, turning to Step S16.

In the embodiment, since the voltage-current curves of the first pull up transistor (PU1) and the second pull down transistor (PD2) are not detected, the Step S15 will be performed.

Step S15, enabling the first word line (WLA) and disabling the second word line (WLB), and writing a complementary data into the SRAM cell and turning to Step S10.

To be specific, when the first word line (WLA) is enabled and the second word line (WLB) is disabled, the first and second measuring transistors (PM1, PM2) will be turned off and the first and second pass-gate transistors (PG1, PG2) will be turned on, thus the SRAM cell can perform the read/write operation. Then, data with complementary value will be written into the SRAM cell. In the embodiment, the complementary value is "1". Afterwards, the step S10 is performed again to disable the first word line (WLA) and enable the second word line (WLB), thereby latching the data "1" in the SRAM cell. Since the value of the stored data is "1" at this time, the Step S13 will be performed later and the voltage-current curves of the first pull up transistor (PU1) and the second pull down transistor (PD2) can be obtained.

Therefore, the four voltage-current curves of the first and second pull down transistors (PD1,PD2) and the first and second pull up transistors (PU1, PU2) are all detected, and the process turns to Step S16.

Step S16, determining the transistor mismatch according to the voltage-current curves of the first and second pull down transistors (PD1, PD2) and the first and second pull up transistors (PU1, PU2). To be specific, the voltage-current curves of the transistors of the same type are compared, if the curves are different, it can be concluded that the mismatch exists between the transistors. Since the voltage-current curve of a failed transistor is obviously different from that of a normal transistor, once the mismatched transistors are detected, the voltage-current curves thereof can be compared to the voltage-current curve of a normal transistor of that type so as to determine the transistor which causes the mismatch.

In summary, according to the method of detecting the transistor mismatch in the SRAM cell of the present invention, two measuring transistors (PM1, PM2) are added in the SRAM cell and two measuring terminals ($\overline{BLM}$, BLM) are provided to detect the voltage-current curves of the pull up transistors and the pull down transistors, thus the transistor mismatch can be determined quickly and conveniently.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of detecting the transistor mismatch in a SRAM cell, wherein the SRAM cell comprises a first and a second pass-gate transistors (PG1, PG2), and a bi-stable circuit which includes a first and a second pull up transistors (PU1, PU2) and a first and a second pull down transistors (PD1, PD2); wherein, the gate electrodes of the first and the second pass-gate transistors are connected to a first word line (WLA), the source electrodes thereof are connected to the outputs of the bi-stable circuit respectively, and the drain electrodes thereof are connected to a first and a second bit line (BL, $\overline{BL}$) respectively; the method comprises:

step a, providing a first and a second measuring transistors (PM1, PM2), the gate electrodes of the first and second measuring transistors (PM1, PM2) are connected to a second word line (WLB), the source electrodes thereof are connected to the outputs of the bi-stable circuit respectively, and the drain electrodes thereof are connected to a first and second measuring terminals ($\overline{BLM}$, BLM) respectively;

step b, enabling the second word line (WLB) and disabling the first word line (WLA);

step c, determining the value of the data stored in the SRAM cell, if the data is "0", turning to step d1; and if the data is 1, turning to step d2;

step d1, detecting the voltage-current curves of the first pull down transistor (PD1) and the second pull up transistor (PU2) at the first and second measuring terminals ($\overline{BLM}$, BLM) respectively, turning to step e;

step d2, detecting the voltage-current curves of the first pull up transistor (PU1) and the second pull down transistor (PD2) at the first and second measuring terminal ($\overline{BLM}$, BLM) respectively, turning to step e;

step e, determining whether the voltage-current curves of the first and second pull down transistors (PD1, PD2) and the first and second pull up transistors (PU1, PU2) are all detected, if no, turning to step f; if yes, turning to step g;

step f, enabling the first word line (WLA) and disabling the second word line (WLB), and writing a complementary data into the SRAM cell and turning to step a;

step g, determining the transistor mismatch according to the voltage-current curves of the first and second pull down transistors (PD1, PD2) and the first and second pull up transistors (PU1, PU2).

2. The method of detecting the transistor mismatch in a SRAM cell according to claim 1, wherein the channel length of the first and second measuring transistors (PM1, PM2) is 28 nm or 40 nm or 55 nm.

3. The method of detecting the transistor mismatch in a SRAM cell according to claim 2, wherein the channel width of the first and second measuring transistors (PM1, PM2) is equal to that of the first and second pass-gate transistors.

4. The method of detecting the transistor mismatch in a SRAM cell according to claim 3, wherein the first and second measuring transistors are NMOS transistors having the same specifications with the first and second pass-gate transistors.

5. The method of detecting the transistor mismatch in a SRAM cell according to claim 1, wherein the step d1 further comprises applying a voltage from 0 to VDD to the first measuring terminal ($\overline{BLM}$) and detecting the current thereof correspondingly to form the voltage-current curve of the first pull down transistor (PD1); and applying a voltage from VDD to 0 to the second measuring terminal (BLM) and detecting the current thereof correspondingly to form the voltage-current curve of the second pull up transistor (PU2).

6. The method of detecting the transistor mismatch in a SRAM cell according to claim 1, wherein the step d2 further comprises applying a voltage from VDD to 0 to the first measuring terminal ($\overline{BLM}$) and detecting the current thereof correspondingly to form the voltage-current curve of the first pull up transistor (PU1); and applying a voltage from 0 to VDD to the second measuring terminal (BLM) and detecting the current thereof correspondingly to form the voltage-current curve of the second pull down transistor (PD2).

* * * * *